US009282661B2

United States Patent
Choi et al.

(10) Patent No.: US 9,282,661 B2
(45) Date of Patent: Mar. 8, 2016

(54) CIRCUIT BOARD HAVING A STANDARD PCMCIA PIN AREA AND AN ADDITIONAL PIN AREA CONNECTED TO DIFFERENT DEVICES

(71) Applicant: SAMSUNG ELECTRONICS CO., LTD., Sugon-si (KR)

(72) Inventors: Young-ho Choi, Suwon-si (KR); Sang-min Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 14/293,530

(22) Filed: Jun. 2, 2014

(65) Prior Publication Data

US 2014/0357104 A1    Dec. 4, 2014

(30) Foreign Application Priority Data

Jun. 3, 2013  (KR) .................. 10-2013-0063748

(51) Int. Cl.
*H05K 5/02* (2006.01)
*H01R 12/50* (2011.01)
*H01R 27/00* (2006.01)
*H04N 21/418* (2011.01)

(52) U.S. Cl.
CPC ............ *H05K 5/0265* (2013.01); *H01R 23/725* (2013.01); *H05K 5/0282* (2013.01); *H01R 27/00* (2013.01); *H04N 21/418* (2013.01)

(58) Field of Classification Search
CPC .............................. H01R 23/72; H01R 23/725
USPC ............................................. 439/55, 78, 131
See application file for complete search history.

(56) References Cited

U.S. PATENT DOCUMENTS

| | | | |
|---|---|---|---|
| 5,574,682 A | 11/1996 | Shinohara | |
| 5,807,140 A | 9/1998 | Hopkins | |
| 5,846,092 A | 12/1998 | Feldman et al. | |
| 6,068,500 A | 5/2000 | Kantner | |
| 6,116,927 A * | 9/2000 | Johnson et al. | 439/131 |
| 6,198,632 B1 * | 3/2001 | Goff | 361/752 |
| 6,288,908 B1 | 9/2001 | Saitoh | |
| 6,746,280 B1 * | 6/2004 | Lu et al. | 439/630 |
| 6,796,843 B1 * | 9/2004 | Ryan et al. | 439/638 |
| 6,863,554 B1 * | 3/2005 | Glad | 439/344 |

(Continued)

FOREIGN PATENT DOCUMENTS

| | | |
|---|---|---|
| JP | 9-73343 A | 3/1997 |
| KR | 10-2009-0084797 A | 8/2009 |
| KR | 10-2012-0014521 A | 2/2012 |

OTHER PUBLICATIONS

Communication issued on Mar. 20, 2015 by the European Patent Office in related Application No. 14170981.6.

*Primary Examiner* — Chandrika Prasad
(74) *Attorney, Agent, or Firm* — Sughrue Mion, PLLC

(57) ABSTRACT

A circuit board includes an extension Personal Computer Memory Card International Association (PCMCIA) connector including a standard PCMCIA pin area including a plurality of pins; and an additional pin area comprising a plurality of pins; and an interface including: a standard PCMCIA interface including a plurality of signals lines connected to the pins of the standard PCMCIA pin area and corresponding to signal lines of a standard PCMCIA card; and an additional PCMCIA interface including a plurality of additional signal lines connected to the pins of the additional pin area.

19 Claims, 9 Drawing Sheets

(56) References Cited

U.S. PATENT DOCUMENTS

| | | | |
|---|---|---|---|
| 7,074,061 B1 * | 7/2006 | Roth et al. | ................... 439/131 |
| 2001/0019907 A1 * | 9/2001 | Glad et al. | ................... 439/131 |
| 2002/0081895 A1 | 6/2002 | Ocheltree et al. | |
| 2002/0178309 A1 | 11/2002 | Tanaka | |
| 2004/0111240 A1 | 6/2004 | Oh et al. | |
| 2004/0224638 A1 | 11/2004 | Fadell et al. | |
| 2012/0033391 A1 | 2/2012 | Heo et al. | |

* cited by examiner

CIRCUIT BOARD HAVING A STANDARD PCMCIA PIN AREA AND AN ADDITIONAL PIN AREA CONNECTED TO DIFFERENT DEVICES

CROSS-REFERENCE TO RELATED APPLICATION

This application claims priority from Korean Patent Application No. 10-2013-0063748 filed on Jun. 3, 2013 in the Korean Intellectual Property Office, the disclosure of which is incorporated herein by reference in its entirety.

BACKGROUND

1. Field

Apparatuses consistent with exemplary embodiments relate to a circuit board including an extension Personal Computer Memory Card International Association (PCMCIA) connector, and more particularly, to a circuit board including an extension PCMCIA connector, which may be compatible with various types of electronic devices having various functions.

2. Description of the Related Art

With the development of broadcasting technology, as consumers' needs for different types of information and a number of broadcasting content providers increase, various types of broadcasting content are available to the consumers. Of the various types of broadcasting content, some of pieces of broadcasting content may be provided to the customers upon receiving payments. For example, a broadcasting content provider encrypts broadcasting content and transmits the encrypted broadcasting content so that only a permitted user can view the paid broadcasting content. In order to view the paid broadcasting content, it is required for a user to install a television (TV) card that can decrypt the encrypted broadcasting content in a display device. For example, in order to view a scrambled/encrypted contents in Europe, a user is required to install a Common Interface Plus (CI+) card in a display device for viewing the encrypted contents, while in the United States, a user is required to install a separate card which includes built-in conditional access system (CAS), such as a cable card, in a display device for viewing the encrypted contents. The CI+ card and the cable card may be connected to the display device through a PCMCIA standard interface. Accordingly, the display device should be provided with a card slot having the PCMCIA standard interface.

Since the card slot of the PCMCIA standard interface occupies a large area on the circuit board, a connector may be provided on the circuit board of the display device, and the card slot may be provided through a separate adapter.

On the other hand, with the advancement of electronic technology and communication technology, a display device may be connected to various peripheral devices or additional devices. Therefore, a display device should be provided with a separate interface in order to be connected to the various additional devices in addition to a TV card mounted thereon. In this case, the circuit board of the display device should be provided with another separate connector to be connected to the separate interface for the various additional devices, and to do so is disadvantageous due to increase in circuit board area and manufacturing cost. Further, in the case where a separate external card adapter for the TV card is provided, having both the external card adapter and the additional devices to the display device may cause inconvenience to the consumers.

Accordingly, there is a need for a circuit board that uses a single connector for the TV card as well as the various peripheral devices or additional devices.

SUMMARY

One or more exemplary embodiments address at least the above problems and/or disadvantages and to provide at least the advantages described below. Accordingly, one or more exemplary embodiments provide a circuit board including an extension PCMCIA connector, which can be compatible with various types of electronic devices having various functions (i.e., a TV card function as well as additional functions) as a single connector.

According to an aspect of an exemplary embodiment, there is provided a circuit board includes an extension PCMCIA connector including a standard PCMCIA pin area including a plurality of pins; and an additional pin area comprising a plurality of pins; and an interface including: a standard PCMCIA interface including a plurality of signals lines connected to the pins of the standard PCMCIA pin area and corresponding to signal lines of a standard PCMCIA card; and an additional PCMCIA interface including a plurality of additional signal lines connected to the pins of the additional pin area.

The pins of the standard pin area of the extension PCMCIA connector may be configured to connect to the standard PCMCIA card.

The standard PCMCIA area and the additional pin area may be adjacent to each other on a same surface of the extension PCMCIA connector.

The additional pin area may include first and second additional pin areas, and the first and second additional pin areas may be arranged on opposite sides of the standard PCMCIA area on a same surface of the extension PCMCIA connector.

The signal lines of the additional PCMCIA interface may include at least one of a control signal line, a data signal line, and a power signal line.

The data signal line may be a data signal line for at least one of Universal Serial Bus (USB) communication, Universal Asynchronous Receiver/Transmitter (UART) communication, and Multimedia over Coax Alliance (MoCA) communication.

The standard PCMCIA interface may be a pseudo standard PCMCIA interface comprising a plurality of signal lines corresponding to the signal lines of the standard PCMCIA interface excluding at least one of the signal lines of the standard PCMCIA interface, and The additional PCMCIA interface may include the at least one signal line of the standard PCMCIA interface in addition to the additional signal lines.

The at least one signal line may include at least one of a power line and a ground line.

The circuit board may be included in a product that is connected only to the additional PCMCIA interface, and the signal lines of the standard PCMCIA interface may be connected to a null signal.

The circuit board is may be included in a product that is connected only to the standard PCMCIA interface, and the additional signal lines may be connected to a null signal.

BRIEF DESCRIPTION OF THE DRAWINGS

The above and/or other aspects will be more apparent from the following detailed description of exemplary embodiments, taken in conjunction with the accompanying drawings of which.

DETAILED DESCRIPTION

Figure 1A:
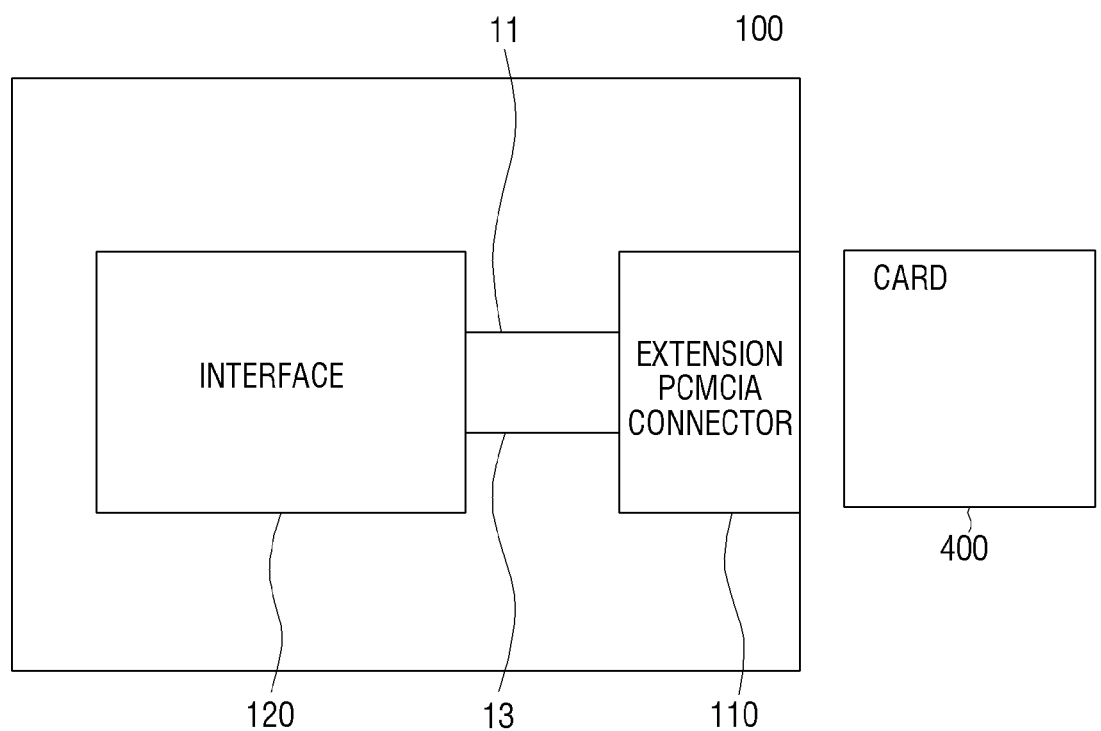
FIG. 1A is a block diagram of a circuit board including an extension PCMCIA connector and an interface according to an exemplary embodiment.

Hereinafter, various exemplary embodiments are described in detail with reference to the accompanying drawings, wherein like reference numerals refer to like elements throughout.

Figure 1B:
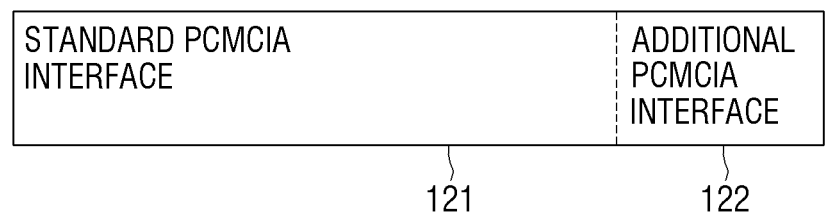
FIG. 1B is a view illustrating the interface having a standard PCMCIA interface and an additional PCMCIA interface according to an exemplary embodiment.

FIG. 1A is a block diagram of a circuit board 100 including an extension Personal Computer Memory Card International Association (PCMCIA) connector 110 and an interface 120 according to an exemplary embodiment and FIG. 1B is a view illustrating the interface 120 having a standard PCMCIA interface 121 and an additional PCMCIA interface 122 according to an exemplary embodiment.

Figure 2:
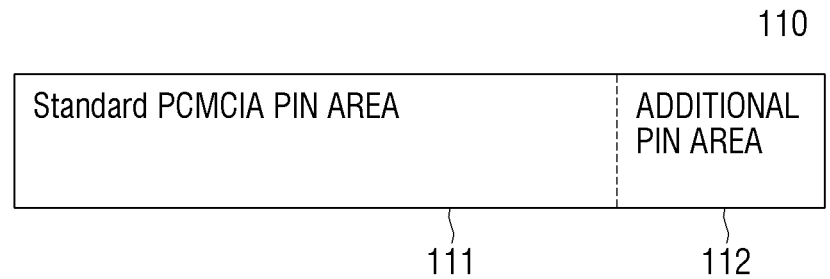
FIGS. 2 and 3 are views illustrating extension PCMCIA connectors according to exemplary embodiments.

Referring to FIGS. 1A, 1B and 2, a circuit board 100 includes an extension PCMCIA connector 110 and an interface 120. The extension PCMCIA connector 100 includes a standard PCMCIA pin area 111 including a plurality of pins connected to signal lines 13 for a standard PCMCIA card 400 and an additional pin area 112 including a plurality of pins connected to predetermined or additional signal lines 11. The interface 120 includes a standard PCMCIA interface 121 including the signal lines 13 for the standard PCMCIA card and an additional PCMCIA interface 122 including the additional signal lines 11.

In an exemplary embodiment, the extension PCMCIA connector 110 may include 92 pins. The interface 120 includes the standard PCMCIA interface 121 including the signal lines 13 for the standard PCMCIA card 400 and the additional PCMCIA interface 122 including the additional signal lines 11.

The PCMCIA is an organization of companies that has defined and developed a standard for a memory card. At present, the PCMCIA standard is not limited to a memory card or device. PCMCIA cards are classified into Type I through Type IV cards. Among the four (4) different types, Type II is provided with a 16/32-bit interface, and is used in a modem, a local area network (LAN) card, and a TV reception card. The standard PCMCIA interface 121 that is used in the TV card is composed of 68 signal lines.

In an exemplary embodiment, if it is assumed that the extension PCMCIA connector 110 includes ninety two (92) pins and the standard PCMCIA interface 121 includes 68 signal lines 13, the additional PCMCIA interface 121 includes 24 signal lines 11.

As previously discussed, a TV card that is used in a display device in the U.S. is called a cable card, and a TV card that is used in a display device in Europe is called a CI+ card. As described above, an interface having 68 standard PCMCIA signal lines 13 should be used for the TV card. Accordingly, if the display device is provided with only the standard PCMCIA interface 121, a separate interface is required for connection to other additional devices. Further, if a user uses an external card adapter having the standard PCMCIA interface 121, a separate interface for additional devices should be provided on the circuit board and such design may cause inconvenience in use.

However, in the case of manufacturing an electronic device using the circuit board including the extension PCMCIA connector 110 according to an exemplary embodiment, it is not necessary to provide a separate interface in the display device. Accordingly, a useable area of the circuit board may be increased, and the manufacturing cost of a display device may also be reduced. Further, since TV card function and additional functions may be implemented in the additional device, a user can use various functions with one additional device. Further, even if various additional devices that perform different functions are developed, the various additional devices are compatible with the same extension PCMCIA connector, and thus the compatibility may be achieved.

The circuit board 100 including the extension PCMCIA connector 110 may be used in an additional device, such as a display device, a TV card combined with an extension kit, a TV card adapter, or an extension kit having no TV card function as to be discussed below referring to FIGS. 6 through 8.

The extension PCMCIA connector 110 is connected to the standard PCMCIA interface 121 and the additional PCMCIA interface 122. Accordingly, respective pins of the extension PCMCIA connector 110 may be considered extensions of the signal lines 13 and the additional signal lines 11 that are connected to the pins. Accordingly, the standard PCMCIA interface 121 and the additional PCMCIA interface 122 will be described as parts of the extension PCMCIA connector 110.

Figure 3:
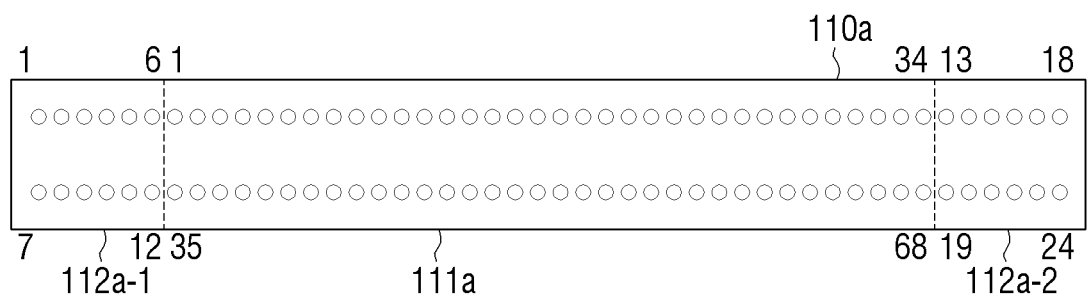

FIGS. 2 and 3 are views illustrating extension PCMCIA connectors 110 according to exemplary embodiments.

Referring to FIG. 2, a standard PCMCIA pin area 111 of FIG. 2 is an area that is connected to the standard PCMCIA interface 121. An additional pin area 112 is an area that is connected to the additional PCMCIA interface 122. As illustrated in FIG. 2, the standard PCMCIA pin area 111 may be arranged on one side of a surface of the extension PCMCIA connector 110, and the additional pin area 112 may be arranged on the other side of the surface of the extension PCMCIA connector 110. That is, the standard PCMCIA pin area 111 and the additional pin area 112 may be arranged adjacent to each other.

Referring to FIG. 3, additional pin areas 112a-1 and 112a-2 connected to the additional PCMCIA interface 122 are arranged on opposite sides of the extension PCMCIA connector 110a, and the standard PCMCIA pin area 111a connected to the standard PCMCIA interface 121 may be arranged in the center portion of the extension PCMCIA connector 110a between the additional pin areas 112a-1 and 112a-2.

The extension PCMCIA connector 110a illustrated in FIG. 3 includes ninety two (92) pins. Accordingly, the standard PCMCIA area 111a includes 68 pins, and the combination of the additional pin areas 112*a*-1 and 112*a*-2 includes twenty four (24) pins. Thus, the first additional pin area 112*a*-1 may include twelve (12) pins, and the second additional pin area 112*a*-2 may also include twelve (12) pins. FIG. 3 illustrates that the extension PCMCIA connector 110*a* is of a female connector type. However, the exemplary embodiment is not limited thereto. It is also possible to connect the same interface with respect to a male connector type.

For convenience in explanation, the extension PCMCIA connector 110 is divided into the standard PCMCIA pin area 111 and the additional pin area 112 as described above with reference to FIGS. 2 and 3. However, in practice, the extension PCMCIA connector 110 may be implemented as one connector having 92 pins. Further, the number of pins of the extension PCMCIA connector 110 is exemplary and may be different according to the design intent. For example, the extension PCMCIA connector 110 may have various numbers of pins, such as eighty eight (88) or ninety six (96) pins. On the other hand, parts of the pins of the standard PCMCIA pin area 111 may be additionally allocated to the additional pin area for further utilization of the additional pin area as described below with reference to FIG. 4.

Figure 4:
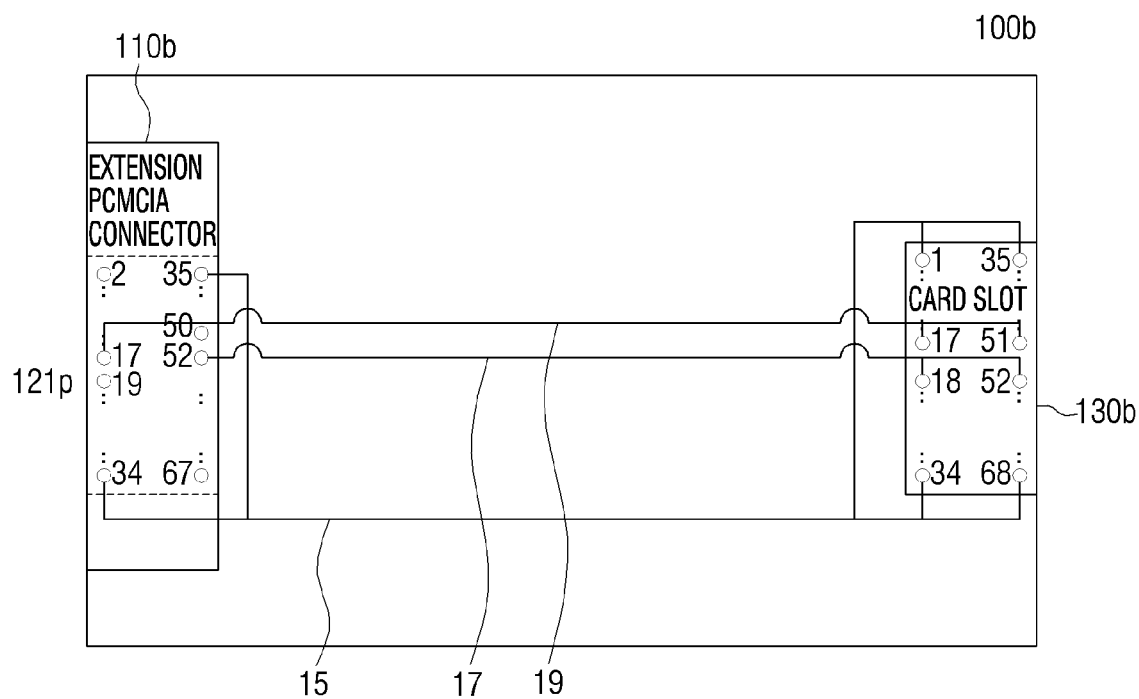
FIG. 4 is a view explaining a pseudo standard PCMCIA interface according to an embodiment of the present disclosure.

FIG. 4 is a view illustrating a pseudo standard PCMCIA interface 121*p* on a circuit board 100*b* including an extension PCMCIA connector 110*b* and a card slot 130*b* according to an exemplary embodiment.

Referring to FIG. 4, the circuit board 100*b* includes the extension PCMCIA connector 110*b* and the card slot 130*b*. The extended PCMCIA connector 110*b* is allocated to the signal lines 11 of the additional PCMCIA interface 122 with respect to parts of the signal lines of the standard PCMCIA interface. The card slot 130*b* is connected to the standard PCMCIA interface 121 on which the TV card can be mounted.

The circuit board 100*b* may allocate at least one of the signal lines 13 included in the standard PCMCIA interface 121 to the additional PCMCIA interface 122. As described above, the circuit board 100*b* may include a pseudo standard PCMCIA interface 121*p* that includes the signal lines included in the standard PCMCIA interface 121 excluding the allocated at least one of the signal lines 13 of the standard PCMCIA interface 121, and an additional PCMCIA interface 122 that further includes the allocated at least one signal line in addition to the signal lines 13. The at least one signal line may be at least one of a power line and a ground line.

In the exemplary embodiment, the PCMCIA interface that is composed of the signal lines included in the standard PCMCIA interface except for the allocated at least one of the signal lines 13 of the standard PCMCIA interface 121 is called a "pseudo standard PCMCIA interface" 121*p*.

In an exemplary embodiment, a case where the extension PCMCIA connector 110 includes 92 signal lines will be described.

First, allocation of the signal lines 13 of the standard PCMCIA interface 121 to the signal lines 11 of the additional PCMCIA interface 122 will be described. As described above, 68 PCMCIA interface signal lines connected to the TV card are standard, and thus should satisfy the standard condition. However, the standard PCMCIA interface 121 includes common signal lines. For example, a ground line and a power line are connected to a plurality of pins of the PCMCIA connector. Accordingly, a number of the pins of the extension PCMCIA connector 110 that are connected to the ground line and the power line may be disconnected. In the exemplary embodiment, not only the data signal line and the control signal line but also the power line and the ground line are considered as signal lines in a wide meaning.

For example, as shown in FIG. 4, the ground line of the standard PCMCIA interface 121 is connected to pins 1, 34, 35, and 68 of the extension PCMCIA connector 110. The $V_{CC}$ power line is connected to pins 17 and 51 of the extension PCMCIA connector 110. The $V_{PP}$ power line is connected to pins 18 and 52 of the extension PCMCIA connector 110. In an exemplary embodiment, the ground line of the standard PCMCIA interface 121 connected to pins 1 and 68 of the PCMCIA connector is disconnected. Further, the $V_{PP}$ power line connected to pin 18 and the $V_{CC}$ power line connected to pin 51 are disconnected. Accordingly, the standard PCMCIA interface 121 including sixty eight (68) signal lines 13 may only use sixty four (64) signal lines to exclude two (2) ground lines and two power lines.

Referring to FIG. 4, the extension PCMCIA connector 110*b* is connected to the pseudo standard PCMCIA interface 121*p*. As described above, pins 1, 18, 51, and 68 among the pins of the extension PCMCIA connector 110*b* are excluded. FIG. 4 illustrates that pin numbers to which a signal line is not connected are excluded for convenience in explanation. In practice, signal lines are successively connected to the respective pins of the extension PCMCIA connector 110*b*, and the respective pins may match the signal lines with successive numbers. In other words, pin 1 through pin 92 of the extension PCMCIA connector 110*b* can be successively allocated.

On the other hand, the TV card is connected to the standard PCMCIA interface 121 and the extension PCMCIA connector 110*b* should be connected to the card slot 130*b*, into which the TV card is inserted, in the exemplary embodiment. In the exemplary embodiment, pins 34 and 35 connected to the ground signal among the pins of the extension PCMCIA connector 110*b* may join the common ground line 15, and then may be connected to pins 1, 34, 35, and 68 of the card slot again. Pin 17 that is connected to the $V_{CC}$ power line 19 among the pins of the extension PCMCIA connector 110*b* may be connected to pins 17 and 51 of the card slot, and pin 52 connected to the $V_{PP}$ power line 17 may be connected to pins 18 and 52 of the card slot.

Therefore, the extension PCMCIA connector 110*b* including 92 pins may use 64 pins as the pseudo standard PCMCIA interface signal lines, and may use 28 pins as the additional PCMCIA interface signal lines.

For example, the additional PCMCIA interface signal lines may be allocated to a standby power line, a clock signal line, a data signal line and a control signal line for universal serial bus (USB) communication, a data signal line and a control signal line for universal asynchronous receiver/transmitter (UART) communication, a data signal line and/or a control signal line for Multimedia Over Coax Alliance (MoCA) communication, a data transmission/reception line and a control signal line for communication with other devices, a "Wake-On" signal line for turning on the display device if the circuit board is used in the additional device, a sensing signal line for sensing a connection between the display device and the additional device, and a ground signal line. As described above, the circuit board including the extension PCMCIA connector 110*b* may be used in a display device, a TV card combined with an extension kit, a TV card adapter, or an extension kit having no TV card function.

Figure 5:
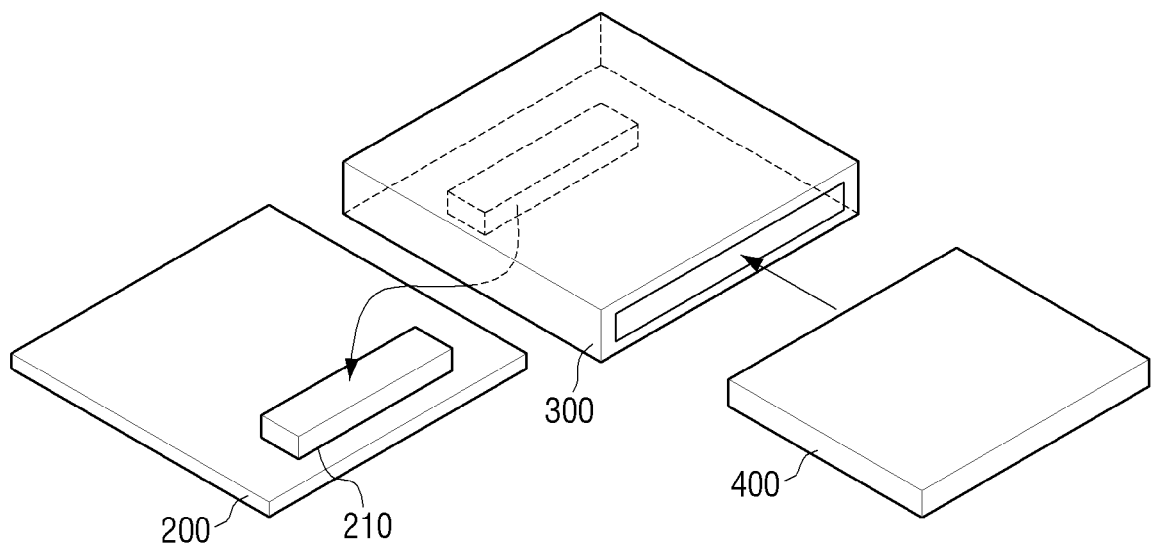
FIG. 5 is a perspective view illustrating mounting a card adaptor on a display device and inserting a TV card in the card adaptor according to an exemplary embodiment.

FIG. 5 illustrates mounting of the card adapter 300 on a display device 200 according to an exemplary embodiment.

Referring to FIG. 5, a display device 200, a card adapter 300, and a TV card 400 are illustrated. FIG. 5 illustrates the display device 200 as a circuit board for convenience in explanation. The display device 200 may include an extension PCMCIA connector 210, and the extension PCMCIA connector 210 may be designed to protrude outwardly so that the additional device may be connected thereto from an outside as shown in the figure.

The extension PCMCIA connector 210 that can be connected to the display device 200 may be arranged on one surface of the card adapter 300, and the card slot into which the TV card 400 can be inserted may be arranged inside the card adapter 300. As described above, the display device 200 and the extension PCMCIA connector 210 arranged on the circuit board of the card adapter 300 may include the standard PCMCIA interface 121/pseudo standard PCMCIA interface 121p and the additional PCMCIA interface 122.

The TV card 400 may be inserted into the card adapter 300, and the card adapter 300 may be mounted on the display device 200 to enable a user to view paid broadcasting content. Further, as described above, the additional device may be implemented by not only the card adapter 300 but also the card adapter combined with the extension kit and the extension kit.

Figure 6:
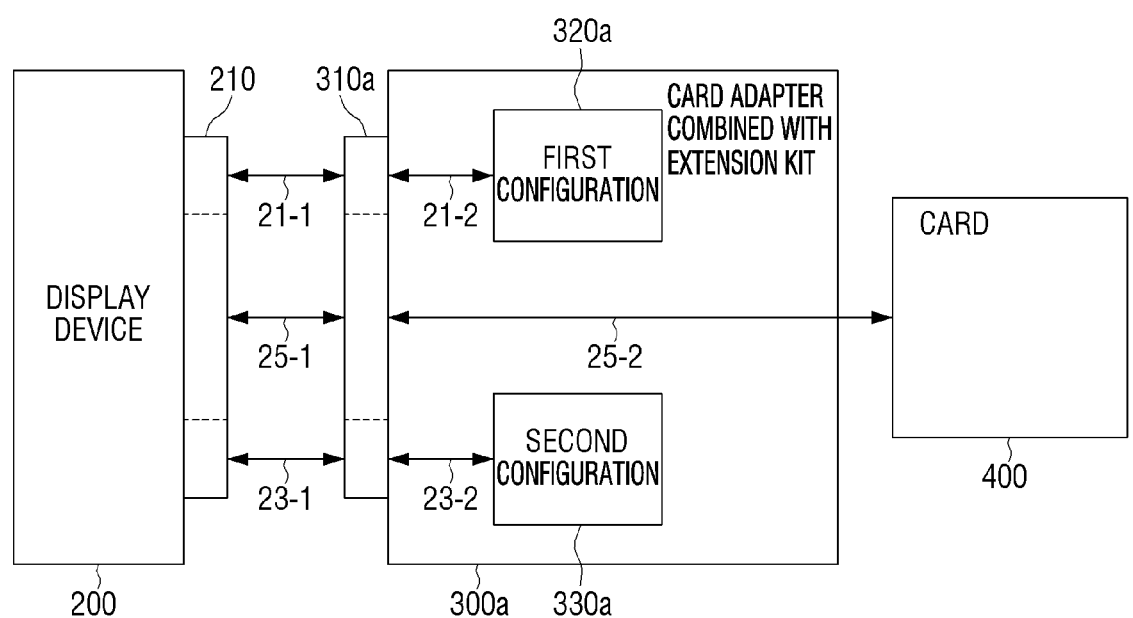
FIG. 6 is a diagram explaining a connection between a display device and a card adapter combined with an extension kit according to an exemplary embodiment.

FIG. 6 is a diagram illustrating a connection between a display device 200 and a card adapter 300a combined with an extension kit according to an exemplary embodiment.

Referring to FIG. 6, a display device 200, a card adapter combined with an extension kit 300a, and a TV card 400 are illustrated. The display device 200 includes an extension PCMCIA connector 210, and the card adapter combined with the extension kit 300a includes an extension PCMCIA connector 310a, a first configuration portion 320a, and a second configuration portion 330a.

The extension PCMCIA connector 210 of the display device 200 and the extension PCMCIA connector 310a of the card adapter combined with the extension kit 300a may include the standard PCMCIA interface area/pseudo standard PCMCIA interface area and the additional PCMCIA interface area. However, the extension PCMCIA connector 210 of the display device 200 and the extension PCMCIA connector 310a of the card adaptor combined with the extension kit 300a may be implemented as a corresponding pair. That is, if the extension PCMCIA connector 210 of the display device 200 includes the pseudo standard PCMCIA interface 121p and is implemented in a female connector type, the extension PCMCIA connector 310a of the card adaptor combined with the extension kit 300a may include the pseudo standard PCMCIA interface 121p and may be implemented in a male connector type.

The display device 200 and the card adapter combined with the extension kit 300a are connected to each other, and a card 400 is inserted. The display device 200 communicates with the card 400 through the standard/pseudo standard PCMCIA interface areas 25-1 and 25-2 to receive broadcasting content. The card adapter combined with the extension kit 300a may further include the first configuration portion 320a and the second configuration portion 330a. The display device 200 may communicate with the first configuration portion 320a through the additional PCMCIA interface areas 21-1 and 21-2 for an additional function. The display device 200 may communicate with the second configuration portion 320a through the additional PCMCIA interface areas 23-1 and 23-2. For example, the first and second configuration portions 23-1 and 23-2 may be implemented by a communicator that can perform communication with the outside and a controller that can perform updating of the card.

As described above, the additional device may be implemented by a device such as an adapter without additional function.

Figure 7:
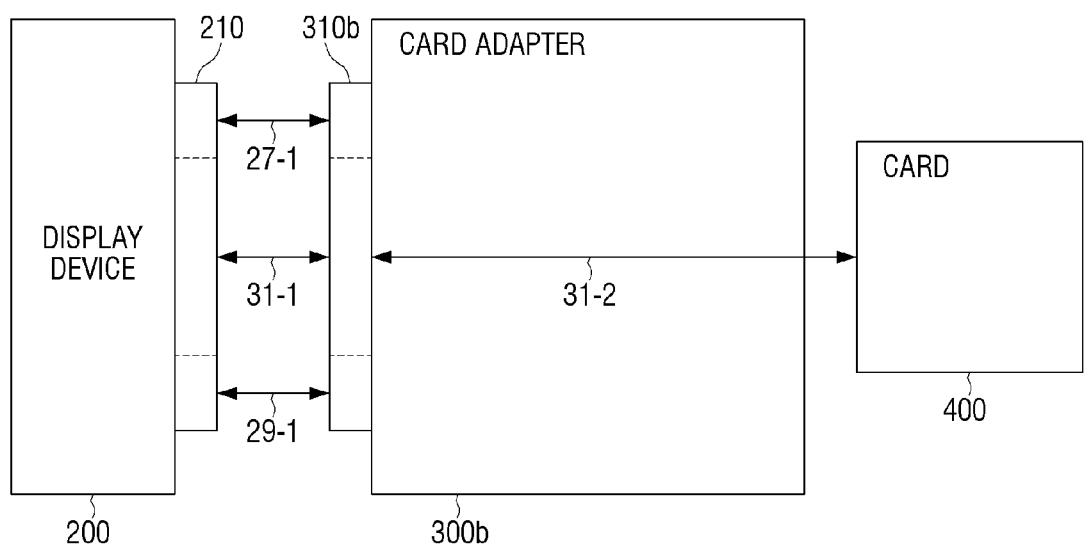
FIG. 7 is a diagram explaining a connection between a display device and a card adapter according to an exemplary embodiment.

FIG. 7 is a diagram explaining a connection between a display device 200 and a card adapter 300b according to an exemplary embodiment.

Referring to FIG. 7, a display device 200, a card adapter 300b, and a card 400 are illustrated. The display device 200 and the card adapter 300b include extension PCMCIA connectors 210 and 310b, respectively. The card adapter 300b is mounted on the display device 200, and the card 400 is inserted into the card adapter 300b.

The card adapter 300b of FIG. 7 does not include any additional configuration, and thus it is not necessary to implement an additional function. If the display device 200 and the card adapter 300b are connected to each other, the standard/pseudo standard PCMCIA interface area of the extension PCMCIA connector 210 of the display device is connected to the standard/pseudo standard PCMCIA interface area of the card adapter 300b (31-1). The standard/pseudo standard PCMCIA interface area of the card adapter 300b is connected to the interface area of the card 400 (31-2). Accordingly, the display device 200 may display the broadcasting content.

On the other hand, the additional PCMCIA interface area of the extension PCMCIA connector 210 of the display device 200 is also connected to the additional PCMCIA interface area of the card adapter 300b (27-1 and 29-1). However, the card adapter 300b does not include an additional configuration, and thus the pins of the additional PCMCIA interface area of the card adapter 300b may be allocated to NC (No Control), or may be connected to a null signal. That is, connection to the null signal may mean remaining as NC.

Since the card adapter 300b includes the same extension PCMCIA connector 310b, it may be connected to the display device 200, and may perform only necessary function at the same time.

Figure 8:
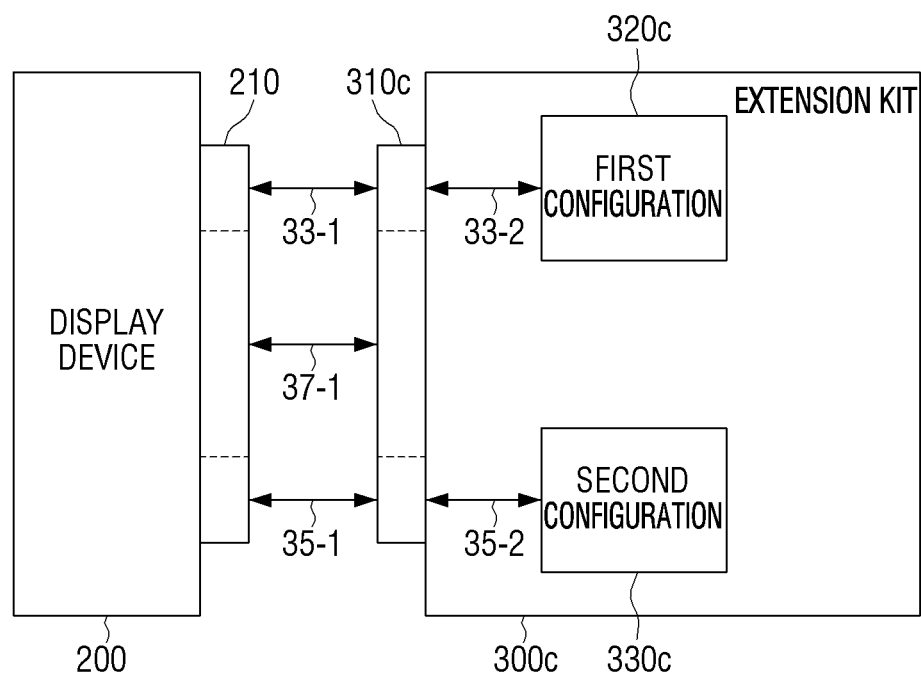
FIG. 8 is a diagram explaining a connection between a display device and an extension kit according to an exemplary embodiment.

The additional device may be implemented by a device, such as an extension kit having no TV function as shown in FIG. 8.

FIG. 8 is a diagram explaining a connection between a display device 200 and an extension kit 300c according to an exemplary embodiment.

Referring to FIG. 8, a display device 200 and an extension kit 300c are illustrated. The display device 200 and the extension kit 300c include extension PCMCIA connectors 210 and 310c, respectively. The display device 200 and the extension kit 300c are connected to each other.

Since the extension kit 300c of FIG. 8 does not include a card slot, implementation of a TV function is not necessary. An additional PCMCIA interface area of the extension PCMCIA connector 210 of the display device 200 is connected to an additional PCMCIA interface area of the extension kit 300c (33-1 and 35-1). The additional PCMCIA interface area of the extension kit 300c is connected to a first configuration portion 320c and a second configuration portion 330c that can perform an additional function (33-2 and 35-2). Accordingly, the first configuration portion 320c and the second configuration portion 330c may perform communication with the display device 200 to perform an additional function.

On the other hand, if the display device 200 and the extension kit 300c are connected to each other, the standard/pseudo standard PCMCIA interface area of the extension PCMCIA connector 210 is connected to the standard/pseudo standard PCMCIA interface area of the extension kit 300c (37-1). However, since the extension kit 300c does not include the card slot, the pins of the standard/pseudo standard PCMCIA interface area of the extension kit 300c may remain as NC or may be connected to a null signal. Since the detailed contents are the same as those as described above with reference to FIG. 7, the detailed description thereof will be omitted.

Referring to FIGS. 7 and 8, it is described that the pins of a non-use area of the extension PCMCIA connector of the additional device are connected to NC or null signal. However, even the pins included in the non-use area may be connected to necessary signal lines according to circumstances. For example, as described above with reference to FIG. 8, the extension kit 300c does not have a TV function, and thus the pins of the standard/pseudo standard PCMCIA interface area may be connected to the null signal. However, since a reset signal line of the standard PCMCIA interface can be commonly used, the reset signal line may be connected to a controller (not illustrated).

While exemplary embodiments have been particularly shown and described above, it will be understood by those skilled in the art that various changes may be made therein without departing from the spirit and scope of the present inventive concept, as defined by the following claims.

What is claimed is:

1. A circuit board comprising:
   an extension Personal Computer Memory Card International Association (PCMCIA) connector comprising:
      a standard PCMCIA pin area comprising a plurality of pins; and
      an additional pin area comprising a plurality of pins; and
   an interface comprising:
      a standard PCMCIA interface comprising a plurality of signals lines connected to the pins of the standard PCMCIA pin area and corresponding to signal lines of a standard PCMCIA card; and
      an additional PCMCIA interface comprising a plurality of additional signal lines connected to the pins of the additional pin area,
      wherein the standard pin area and the additional pin area are configured to simultaneously connect to different devices.

2. The circuit board as claimed in claim 1, wherein the pins of the standard pin area of the extension PCMCIA connector are configured to connect to the standard PCMCIA card.

3. The circuit board as claimed in claim 1, wherein the standard PCMCIA area and the additional pin area are adjacent to each other on a same surface of the extension PCMCIA connector.

4. The circuit board as claimed in claim 1, wherein the additional pin area comprises first and second additional pin areas, and the first and second additional pin areas are arranged on opposite sides of the standard PCMCIA area on a same surface of the extension PCMCIA connector.

5. The circuit board as claimed in claim 1, wherein the signal lines of the additional PCMCIA interface comprise at least one of a control signal line, a data signal line, and a power signal line.

6. The circuit board as claimed in claim 5, wherein the data signal line is a data signal line for at least one of Universal Serial Bus (USB) communication, Universal Asynchronous Receiver/Transmitter (UART) communication, and Multimedia over Coax Alliance (MoCA) communication.

7. The circuit board as claimed in claim 1, wherein the standard PCMCIA interface is a pseudo standard PCMCIA interface comprising a plurality of signal lines corresponding to the signal lines of the standard PCMCIA interface excluding at least one of the signal lines of the standard PCMCIA interface, and the additional PCMCIA interface comprises the at least one signal line of the standard PCMCIA interface in addition to the additional signal lines.

8. The circuit board as claimed in claim 7, wherein the at least one signal line comprises at least one of a power line and a ground line.

9. The circuit board as claimed in claim 7, wherein the circuit board is included in a product that is connected only to the additional PCMCIA interface, and the signal lines of the standard PCMCIA interface are connected to a null signal.

10. The circuit board as claimed in claim 7, wherein the circuit board is included in a product that is connected only to the standard PCMCIA interface, and the additional signal lines are connected to a null signal.

11. The circuit board as claimed in claim 1, wherein the extension PCMCIA connector is a female type or a male type single connector that is paired with the interface.

12. The circuit board as claimed in claim 1, wherein the standard pin area is configured to connect with a card that is used to receive a broadcast signal and display the received broadcast signal on a display device, and the additional pin area is implemented by a communicator that can perform communication with a controller that performs updating of the card.

13. The circuit board as claimed in claim 12, wherein the additional pin area is configured to communicate with the display device to perform an additional function.

14. The circuit board as claimed in claim 9, wherein a reset signal line of the standard PCMCIA interface is connected to a controller configured to reset the null signal.

15. A circuit board comprising:
   an extension PCMCIA connector comprising:
      a first pin area configured to connect to a television (TV) card; and
      a second pin area configured to connect to an additional device; and
   an interface comprising:
      a first interface comprising a plurality of signal lines connected to the first pin area; and
      a second interface comprising a plurality of additional signal lines connected to the second pin area,
      wherein the first pin area and the second pin area are configured to simultaneously connect to the TV card and the additional device.

16. The circuit board as claimed in claim 15, wherein the first pin area and the second pin area are arranged adjacent to each other.

17. The circuit board as claimed in claim 15, wherein the second pin area comprises two second pin areas, and the first pin area is interposed between the two second pin areas.

18. The circuit board as claimed in claim 15, wherein the circuit board is included in a product that is connected only to the second interface, and the standard signal lines are connected to a null signal.

19. The circuit board as claimed in claim 15, wherein the circuit board is included in a product that is connected only to the first interface, and the additional signal lines are connected to a null signal.

* * * * *